（12） United States Patent
Huang

(10) Patent No.: US 7,233,203 B2
(45) Date of Patent: Jun. 19, 2007

(54) DIFFERENTIAL AMPLIFIER

(75) Inventor: Chin-Wen Huang, Dashe Township, Kaohsiung County (TW)

(73) Assignee: Realtek Semiconductor Corp., Hsinchu (TW)

( * ) Notice: Subject to any disclaimer, the term of this patent is extended or adjusted under 35 U.S.C. 154(b) by 187 days.

(21) Appl. No.: 11/197,992

(22) Filed: Aug. 5, 2005

(65) Prior Publication Data

US 2007/0030069 A1   Feb. 8, 2007

(51) Int. Cl.
*H03F 3/45* (2006.01)
(52) U.S. Cl. .................... 330/259; 330/258
(58) Field of Classification Search ............... None
See application file for complete search history.

(56) References Cited

U.S. PATENT DOCUMENTS

| | | | | |
|---|---|---|---|---|
| 4,823,092 A | * | 4/1989 | Pennock | 330/253 |
| 5,436,594 A | * | 7/1995 | Pace et al. | 330/258 |
| 5,668,468 A | * | 9/1997 | Cargill | 323/316 |
| 6,356,152 B1 | * | 3/2002 | Jezdic et al. | 330/253 |

\* cited by examiner

*Primary Examiner*—Robert Pascal
*Assistant Examiner*—Krista Flanagan
(74) *Attorney, Agent, or Firm*—Thomas, Kayden, Horstemeyer & Risley

(57) ABSTRACT

A differential amplifier comprises an operational amplifier, comprising a positive output terminal, a negative output terminal, and a feedback terminal; a common mode sensing circuit coupled to the positive output terminal and the negative output terminal, for generating a sensed common mode voltage of the positive output terminal and the negative output terminal of the operational amplifier; and a feedback circuit comprising a common mode input terminal for receiving the sensed common mode voltage, a reference input terminal for receiving a reference voltage, and a first resistive component coupled between the common mode input terminal and the reference input terminal, the feedback circuit generating a feedback signal according to the common mode voltage and the reference voltage; wherein the feedback terminal of the operational amplifier receives the feedback signal of the feedback circuit.

14 Claims, 9 Drawing Sheets

DIFFERENTIAL AMPLIFIER

BACKGROUND OF THE INVENTION

1. Field of the Invention

The invention relates in general to an amplifier, and more particularly to a differential amplifier and a method of improving stability thereof.

2. Description of the Related Art

Differential amplifier circuits are widely used in the electronics industry and are generally preferred over their single-ended counterparts because of their better common-mode noise rejection, reduced harmonic distortion, and increased output voltage swing. However, due to high impedance at the output nodes of the differential amplifier circuit, a common mode feedback (CMFB) control mechanism is often required in addition to well define the common mode voltage (Vcm). FIG. 1 shows a typical differential amplifier architecture. The differential amplifier architecture 100 includes an operational amplifier (OpAmp) 110, together with a plurality of resistors R1, R2, configured as an inverting type amplifier, with a CMFB loop 120. The CMFB loop 120 includes a common mode (CM) detector 122 and a compensation signal generator 124. The CM detector 122 senses the output common mode voltage based on the voltage outputs of the OpAmp 110, i.e., Vcm=(Von+Vop)/2. Then, utilizing the compensation signal generator 124, the common mode voltage Vcm is compared with a reference voltage Vref, and a corresponding error-correcting signal Vfb based on the differences between the Vcm and Vref is fed back to the biasing circuitry of the OpAmp 110 so as to compensate for and maintain the output common mode voltage level.

The CMFB loop 120 needs to be carefully designed, as the inherent parasitic effects of the circuit components introduce additional poles that degrade common mode stability. FIG. 2 shows a Bode plot illustrating the magnitude response of the differential amplifier circuit. As shown in the figure, the differential amplifier circuit usually possesses two significant poles P1 and P2, with the second pole P2 oftentimes being contributed by the unavoidable parasitic. As generally followed by designers as a rule of thumb, the differential mode feedback factor $\beta_{DM}$ is designed, so that the corresponding $1/\beta_{DM}$ curve falls between the first pole P1 and the second pole P2, to render a stable differential feedback loop. For example, as shown in FIG. 2, the curve of $1/\beta_{DM}=(R1+R2)/R1=2$, by setting R1=R2, falls between P1 and P2. However, because in most of the cases the differential amplifier circuit has different differential feedback path and common mode feedback path, thus different differential and common mode feedback factors, a stable common mode feedback loop is not guaranteed merely by applying such a rule of thumb. For example, as shown in FIG. 2, the curve of $1/\beta_{CM}$, here equaling to 1 with $\beta_{CM}$ being the common mode feedback factor, falls below the second pole P2 rendering an unstable common mode feedback loop.

Two common approaches of fixing such common mode feedback loop instability during amplifier designed are illustrated in FIG. 3A and FIG. 3B. One can either design the amplifier so that the curve representing open loop gain shifts downwards, as shown by the dashed curve in FIG. 3A, to fit the common mode feedback factor curve between P1 and P2, or design the amplifier so that the common mode feedback factor curve shifts upwards, as shown by the dashed curve in FIG. 3B. The later approach shown in FIG. 3B is preferable because it does not induce potential additional input offset and noise problems, as the former approach shown in FIG. 3A may do.

SUMMARY OF THE INVENTION

It is therefore an object of the invention to provide a differential amplifier that achieves common mode stability without significantly downgrading open loop gain.

According to embodiments of the invention, a differential amplifier is disclosed. The differential amplifier comprises an operational amplifier, comprising a positive output terminal, a negative output terminal, and a feedback terminal; a common mode sensing circuit coupled to the positive output terminal and the negative output terminal, for generating a sensed common mode voltage of the positive output terminal and the negative output terminal of the operational amplifier; and a feedback circuit comprising a common mode input terminal for receiving the sensed common mode voltage, a reference input terminal for receiving a reference voltage, and a first resistive component coupled between the common mode input terminal and the reference input terminal, the feedback circuit generating a feedback signal according to the common mode voltage and the reference voltage; wherein the feedback terminal of the operational amplifier receives the feedback signal of the feedback circuit.

According to embodiments of the invention, a differential amplifier is further disclosed. The differential amplifier comprises a forward gain unit, comprising an input port, an output port, and a common mode feedback terminal, for providing a forward gain; a differential mode feedback path coupled between the output port and the input port; and a common mode feedback path, comprising: a common mode sensing unit coupled to the output port, for sensing a common mode voltage of an output signal at the output port; a feedback gain unit coupled to the common mode sensing unit, receiving the sensed common mode voltage and a reference voltage, for generating a feedback signal according to the sensed common mode voltage and the reference voltage; and a first resistive component, whereof one end receives the sensed common mode voltage, and the other end receives the reference voltage; wherein the feedback signal is fed back to the common mode feedback terminal of the forward gain unit. Other objects, features, and advantages of the invention will become apparent from the following detailed description of the preferred but non-limiting embodiments. The following description is made with reference to the accompanying drawings.

DETAILED DESCRIPTION OF THE INVENTION

Figure 5:
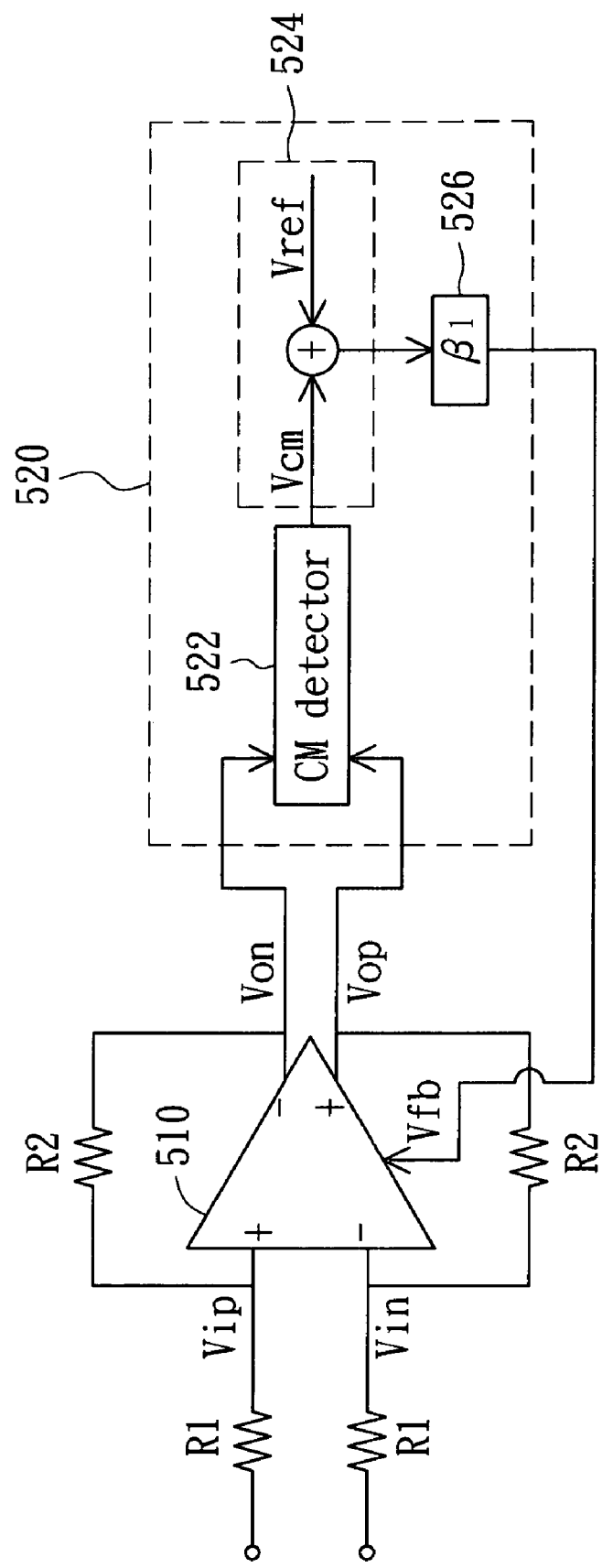
FIG. 5 shows a block diagram of a differential amplifier according to an embodiment of the invention.

FIG. 5 shows a block diagram of a differential amplifier according to an embodiment of the invention. The differential amplifier 500 includes an amplifying circuit, such as an operational amplifier 510, a differential mode feedback path comprised of a plurality of resistors R1 and R2, which, in conjunction with the operational amplifier 510, form an inverting-type amplifier, and a common mode feedback (CMFB) path 520. The operational amplifier 510 has two input terminals, to which input voltages Vin and Vip are applied, and two output terminals, to which output voltages Vop and Von are generated. In this embodiment, the common mode feedback path 520 comprises a common mode detector 522, which senses the common mode voltage Vcm at the two output terminals of the operational amplifier 510, and a compensation signal generator 524, which compares the common mode voltage Vcm with a reference voltage Vref and accordingly generates a feedback compensation signal Vfb. The feedback signal Vfb controls a compensating mechanism of the operational amplifier 510 so that undesired fluctuations in the common mode voltage at the output terminals of the operational amplifier 510 is compensated for. On top of those, the common mode feedback path 520 further includes a feedback factor component 526, which contributes to the common mode feedback path 520 a feedback factor β1, such that the stability of the common mode feedback loop of this differential amplifier 500 can be properly accounted for through the mechanism shown in FIG. 3B.

Figure 6:
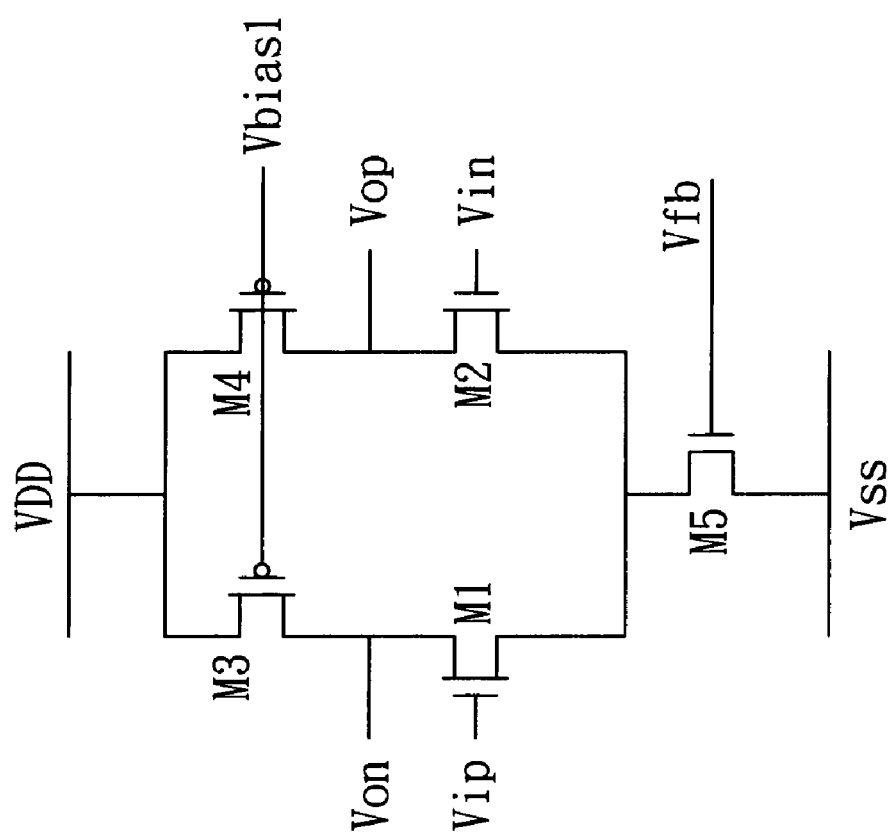
FIG. 6 shows detailed view of the operational amplifier 510 shown in FIG. 5 according to an embodiment of the invention.

FIG. 6 shows detailed view of the operational amplifier 510 according to an embodiment of the invention. The operational amplifier 510 comprises two input transistors M1 and M2 as gain stage, two DC biased transistors M3 and M4 as active loads, and a feedback controlled transistor M5 as current source, and at the same time, serving as common mode feedback mechanism. As is obvious to those of ordinary skill in the art upon examining FIG. 6, any alteration in the feedback signal Vfb at the gate of the transistor M5 will cause a corresponding change in the common mode voltage level of the output voltages Vop and Von. Such dependency between the feedback signal Vfb and the common mode voltage level of the output voltages Vop and Von, together with the operation of the CMFB path 520, which will be detailed below, accounts for the compensation for any fluctuation in the common mode voltage of the output voltages Vop and Von.

Figure 7:
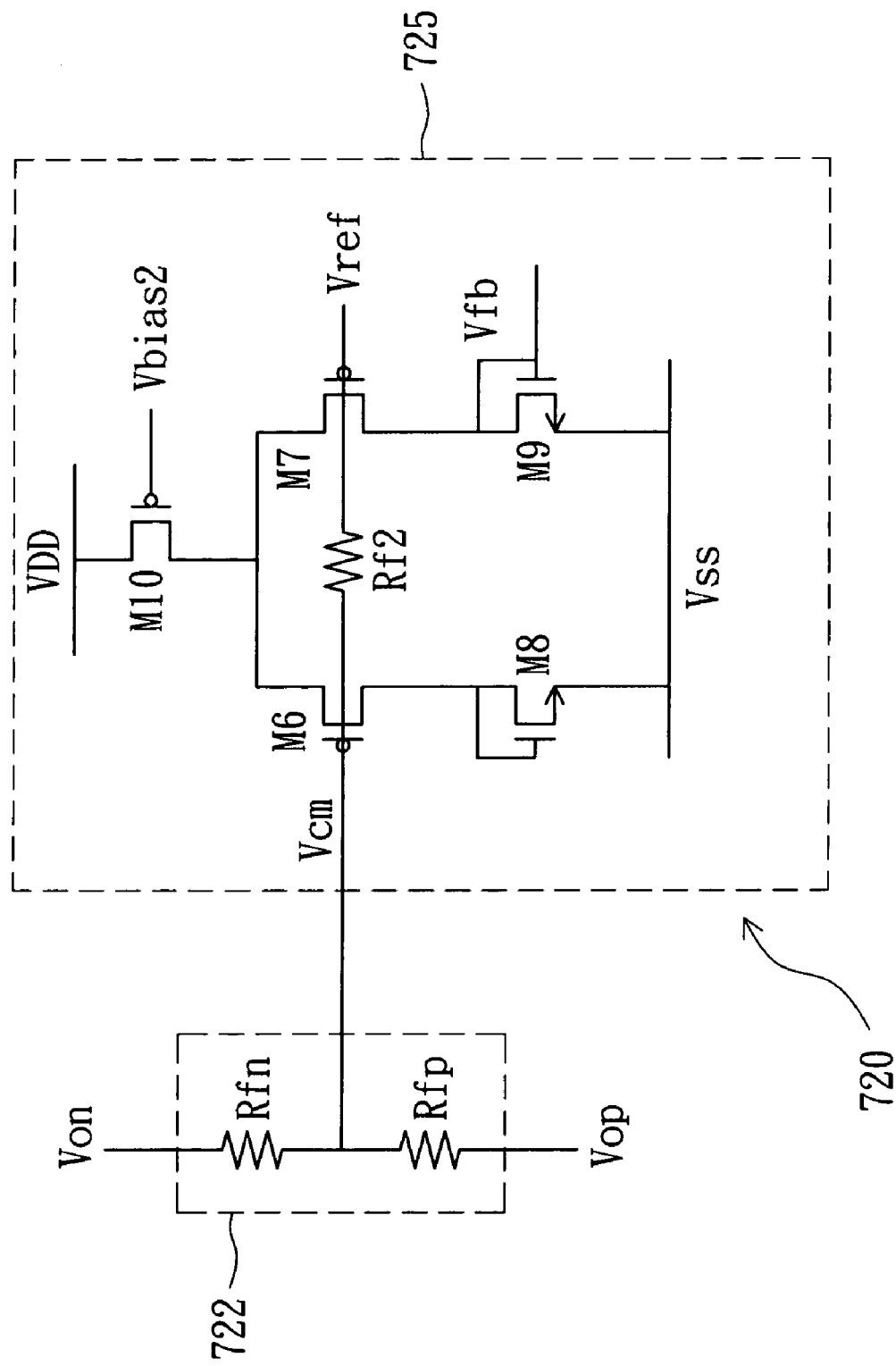
FIG. 7 shows detailed view of the CMFB circuit 520 shown in FIG. 5 according to an embodiment of the invention.

FIG. 7 shows detailed view of a CMFB circuit 720 according to an embodiment of the invention. The CMFB circuit 720 can be implemented in the CMFB path 520 shown in FIG. 5. The CMFB circuit 720 comprises a resistor network 722, which embodies the common mode detector 522 shown in FIG. 5, and an error amplifier circuit 725, which embodies the compensation signal generator 524 together with the feedback factor component 526. The resistor network 722 includes a first resistor Rfn and a second resistor Rfp disposed between the negative output terminal (voltage) Von and the positive output terminal (voltage) Vop of the inverting-type amplifier described above. Herein Rfn and Rfp are of the same resistances, and as a result, the common mode voltage level Vcm of the two output voltages Vop and Von can be seen at the node between Rfn and Rfp, conforming to the relation of Vcm =(Vop+Von)/2.

The error amplifier circuit 725 comprises two input transistors M6 and M7 as gain stage, two diode-connected transistors M8 and M9 as active loads, a DC-biased transistor M10 as current source, and a resistor Rf connected between the gates of the input transistors M6 and M7, for serving a feedback factor determining purpose. The sensed common mode voltage Vcm extracted by the resistor network CM detector 722 is input to the gate of the input transistor M6, while a reference voltage Vref is fed to the gate of the input transistor M7. The feedback signal Vfb is then output at the connected drain and gate of the transistor M9, back to the operational amplifier 510. After understanding the disclosed drawings and the detailed descriptions embodiment, one of ordinary skill in the art would readily observe that any fluctuation or alteration in the common mode voltage of the output voltages Vop and Von of the operational amplifier 510 will be properly compensated through the operations of the error amplifier circuit 725 and the feedback mechanism including the feedback controlled transistor M5, and the common mode voltage Vcm will be maintained at a desired value.

To be more specifically, for instance, when the common mode voltage at the output of the inverting-type amplifier including the operational amplifier 510 suffers from a upward (i.e., positive) fluctuation or deviation from its designed nominal level, by nature of the error amplifier circuit 725 the feedback signal Vfb will be forced to shift upwards, and eventually by nature of the circuit structure of the operational amplifier 510, said common mode voltage will be compensated downwards in response to an upward level shifting at the gate of the transistor M5. Accordingly, operations of the opposite side compensation, i.e., when a downward fluctuation or deviation from the nominal common mode voltage occurs, can be easily derived, and will not be further detailed herein.

Figure 8:
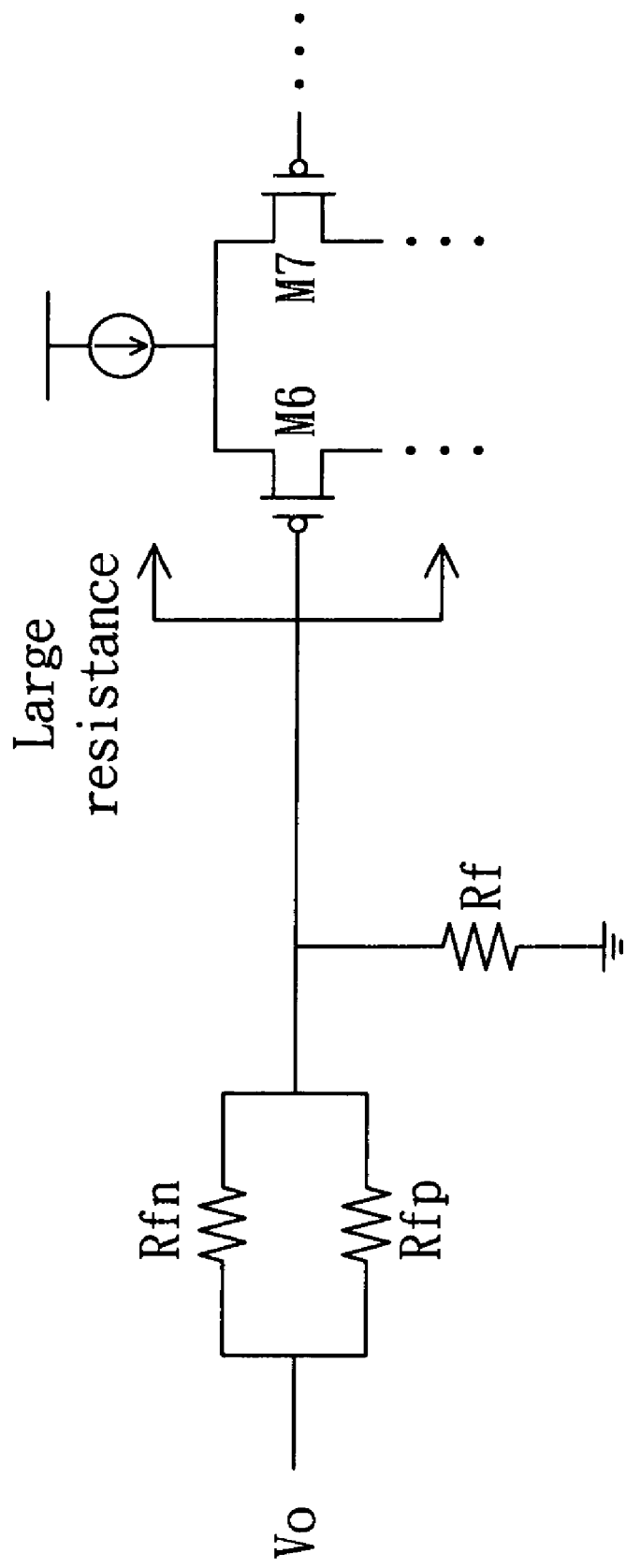
FIG. 8 shows an equivalent circuit illustration of the feedback factor β1 shown in FIG. 5 in view of the circuit implementation of FIG. 7.

In order to explain the effect of the inclusion of the resistor Rf between the sensed common mode voltage Vcm and the reference voltage Vref at the input terminals of the error amplifier circuit 725, please refer to FIG. 8, which illustrates an equivalent circuit diagram of the CMFB circuit 720. As shown in FIG. 8, the CMFB path is equivalent to the parallel-connected Rfn and Rfp serially connected with the parallel-connected Rf and a large resistance looking into the gate of the transistor M6. Since the usually much smaller Rf dominates a parallel connection, the common mode feedback factor β1 can be easily derived as:

$$\beta 1 = \frac{Rf}{Rf + (Rfn \| Rfp)}.$$

As a result, by adequately choosing the resistance values of the resistors Rfn, Rfp, as well as Rf, a common mode feedback factor β1 that renders a stable common mode feedback loop, as explained earlier accompanying the concept shown in FIG. 3B, can be obtained. In an preferred embodiment, the common mode feedback factor β1 is designed to be of the same value as the differential mode feedback factor $\beta_{DM}$, for example, β1 being equal to 1/2 in the case shown in FIG. 3B by setting the ratio among the resistors Rfn : Rfp: Rf =2:2:1, such that the stability of both the differential mode feedback loop and the common mode feedback loop can be more easily simultaneously secured.

Figure 1:
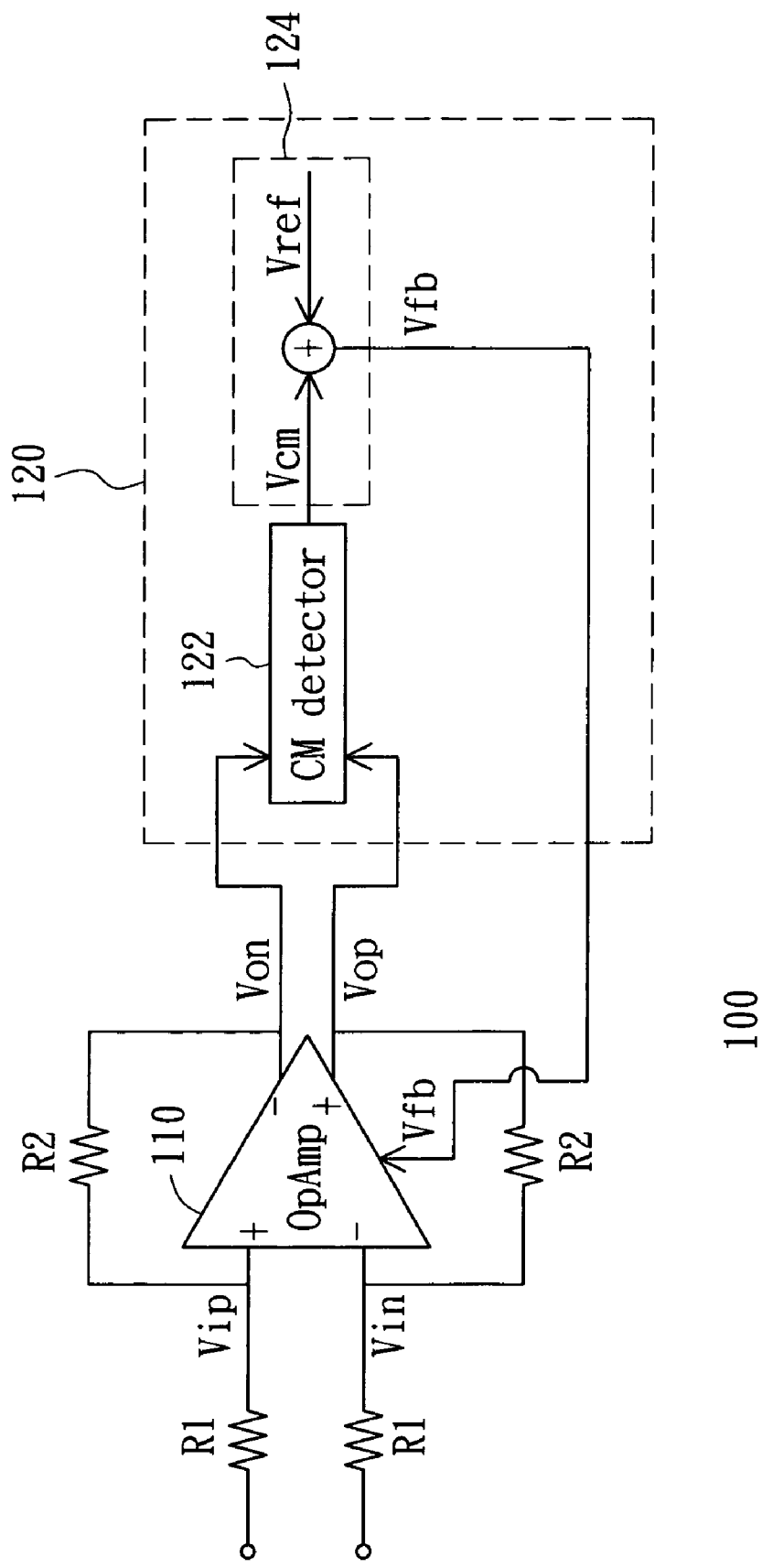
FIG. 1 shows a typical differential amplifier architecture.
Figure 2:
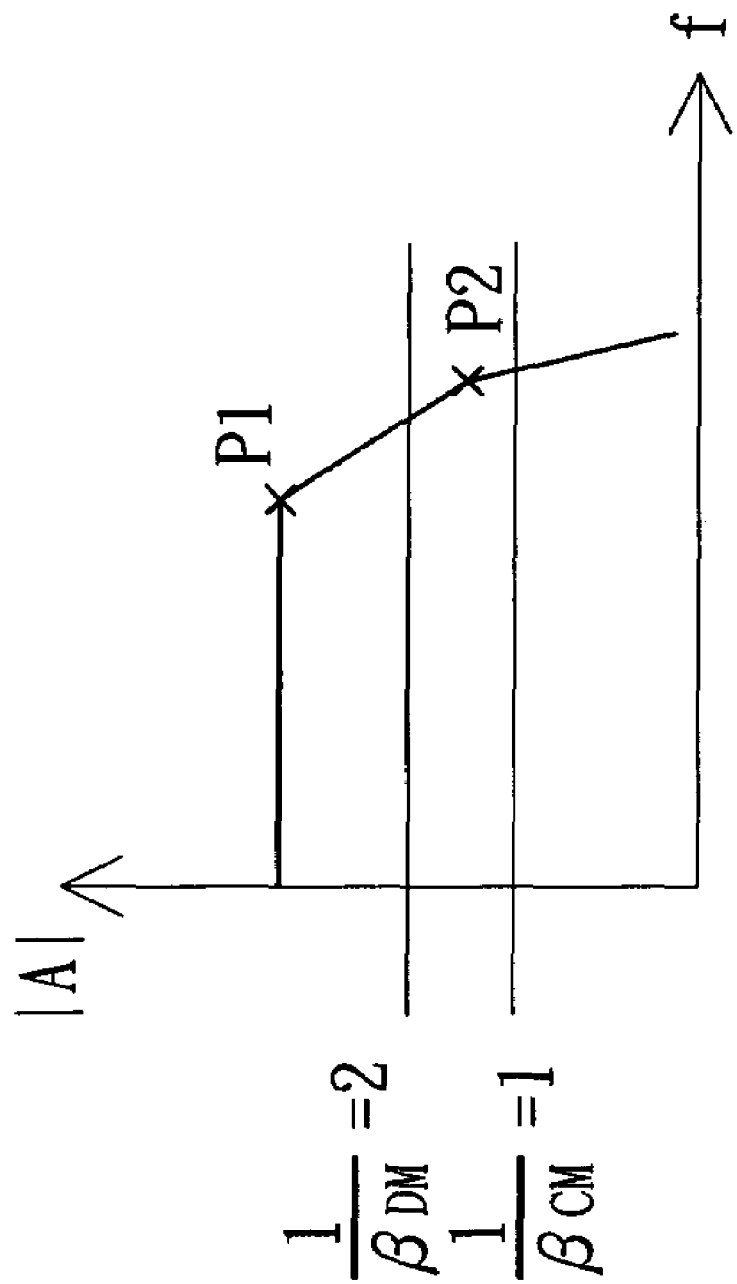
FIG. 2 shows a Bode plot illustrating the magnitude response of the differential amplifier circuit.
Figure 3A:
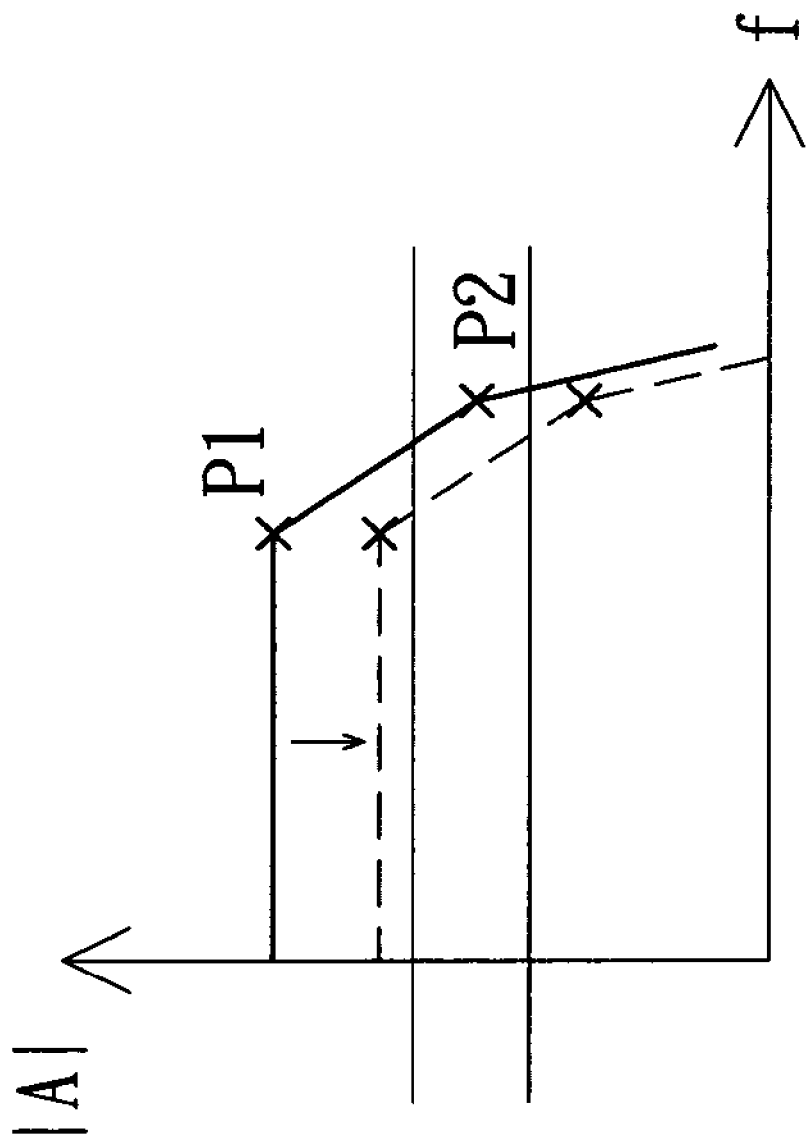
FIGS. 3A and 3B show Bode plots illustrating two approaches of achieving CMFB loop stability.
Figure 3B:
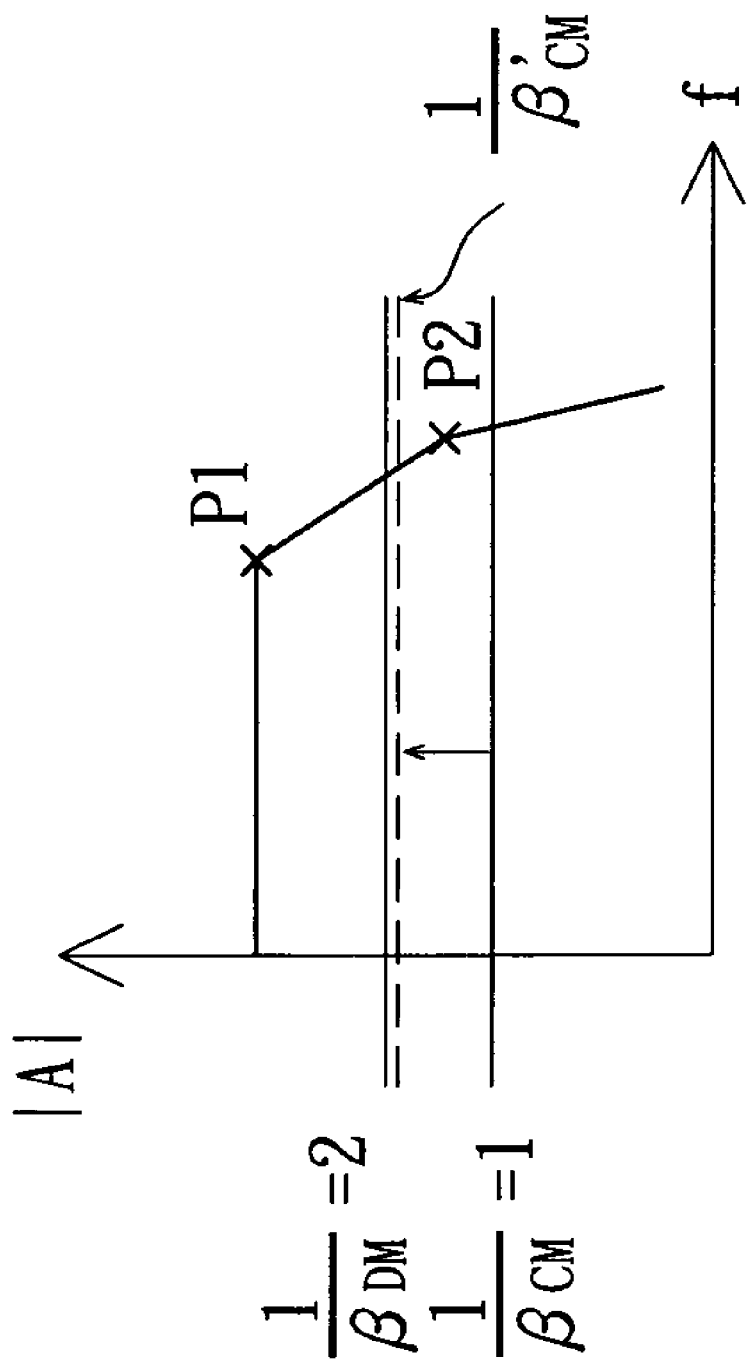
Figure 4:
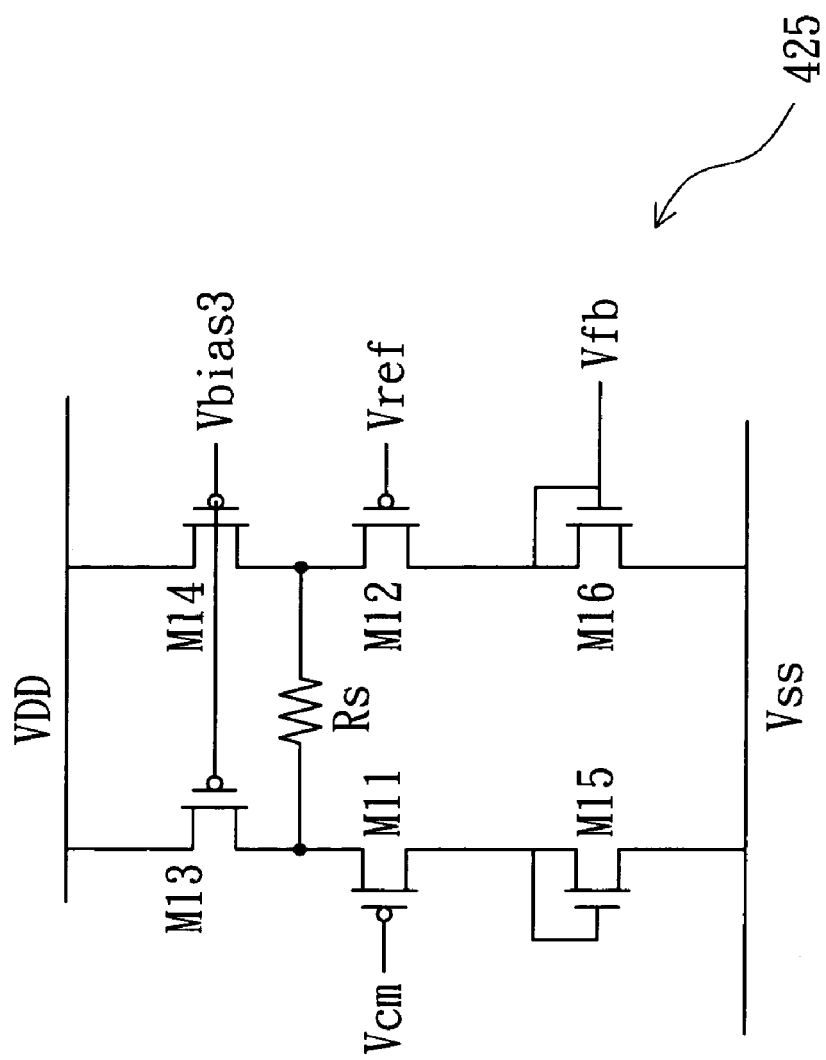
FIG. 4 (PRIOR ART) shows a circuit diagram of a compensation signal generator used in CMFB loop.

Prior art teaches an error amplifier circuit 425 as shown in FIG. 4. The error amplifier circuit 425 is different from the error amplifier circuit 725 of FIG. 7 in that a resistor Rs is placed between the sources of the two input transistors, here, M1 and M12, instead of the resistor Rf between the gates of the two transistors M6 and M7. By introducing Rs, the stability of the common mode feedback loop can also be achieved, but significant downgrade of the open loop gain, as shown in FIG. 3A, is inevitably incurred. However, by using the error amplifier circuit 725 of the embodiment of the invention, common mode feedback loop stability can be achieved without significantly hurting the open loop gain.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A differential amplifier, comprising:
   an operational amplifier, comprising a positive output terminal, a negative output terminal, and a feedback terminal;
   a common mode sensing circuit coupled to the positive output terminal and the negative output terminal, for generating a sensed common mode voltage of the positive output terminal and the negative output terminal of the operational amplifier; and
   a feedback circuit comprising a common mode input terminal for receiving the sensed common mode voltage, a reference input terminal for receiving a reference voltage, and a first resistive component coupled between the common mode input terminal and the reference input terminal, the feedback circuit generating a feedback signal according to the common mode voltage and the reference voltage;
   wherein the feedback terminal of the operational amplifier receives the feedback signal of the feedback circuit.

2. The differential amplifier of claim 1, wherein the common mode sensing circuit comprises a second resistive component and a third resistive component coupled in series.

3. The differential amplifier of claim 1, wherein the feedback circuit comprises a MOS-based amplifier.

4. The differential amplifier of claim 1, wherein the feedback circuit comprises a first MOS transistor and a second MOS transistor, and the first resistive component is connected between the gate of the first MOS transistor and the gate of the second MOS transistor.

5. The differential amplifier of claim 1, wherein the first resistive component comprises a resistor.

6. The differential amplifier of claim 1, wherein the differential mode feedback loop of the differential amplifier is stable, and the common mode feedback loop of the differential amplifier is stable.

7. The differential amplifier of claim 1, wherein the common mode feedback factor of the differential amplifier is substantially the same as the differential mode feedback factor of the differential amplifier.

8. A differential amplifier, comprising:
   a forward gain unit, comprising an input port, an output port, and a common mode feedback terminal, for providing a forward gain;
   a differential mode feedback path coupled between the output port and the input port; and
   a common mode feedback path, comprising:
      a common mode sensing unit coupled to the output port, for sensing a common mode voltage of an output signal at the output port;
      a feedback gain unit coupled to the common mode sensing unit, receiving the sensed common mode voltage and a reference voltage, for generating a feedback signal according to the sensed common mode voltage and the reference voltage; and
      a first resistive component, whereof one end receives the sensed common mode voltage, and the other end receives the reference voltage;
   wherein the feedback signal is fed back to the common mode feedback terminal of the forward gain unit.

9. The differential amplifier of claim 8, wherein the forward gain unit comprises an operational amplifier.

10. The differential amplifier of claim 8, wherein the feedback gain unit comprises a first MOS transistor and a second MOS transistor, and the first resistive component is connected between the gate of the first MOS transistor and the gate of the second MOS transistor.

11. The differential amplifier of claim 8, wherein the common mode sensing unit comprises a second resistive component and a third resistive component coupled in series.

12. The differential amplifier of claim 8, wherein the first resistive component comprises a resistor.

13. The differential amplifier of claim 8, wherein the differential mode feedback loop of the differential amplifier is stable, and the common mode feedback loop of the differential amplifier is stable.

14. The differential amplifier of claim 8, wherein the common mode feedback factor of the differential amplifier is substantially the same as the differential mode feedback factor of the differential amplifier.

* * * * *